US011386831B2

(12) United States Patent
Hughes et al.

(10) Patent No.: US 11,386,831 B2
(45) Date of Patent: Jul. 12, 2022

(54) DISPLAY, LED CHIP THEREFOR, PIXEL THEREFOR, CONTROLLING METHOD THEREFOR, COMPUTER PROGRAM THEREFOR

(71) Applicant: Facebook Technologies, LLC, Menlo Park, CA (US)

(72) Inventors: Padraig Hughes, Cork (IE); William Henry, Cork (IE); Joseph O'Keeffe, Bellevue, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/174,678

(22) Filed: Feb. 12, 2021

(65) Prior Publication Data

US 2021/0174730 A1    Jun. 10, 2021

Related U.S. Application Data

(63) Continuation of application No. 16/707,890, filed on Dec. 9, 2019, now Pat. No. 10,957,241, which is a (Continued)

(30) Foreign Application Priority Data

Oct. 22, 2014 (GB) .................................... 1418772

(51) Int. Cl.
*G09G 3/20* (2006.01)
*H01L 25/075* (2006.01)
(Continued)

(52) U.S. Cl.
CPC ....... *G09G 3/2088* (2013.01); *H01L 25/0753* (2013.01); *G09G 3/32* (2013.01); (Continued)

(58) Field of Classification Search
None
See application file for complete search history.

(56) References Cited

U.S. PATENT DOCUMENTS 8,791,474 B1 * 7/2014 Bibl ..................... G09G 3/2003
                                                          257/89
9,000,466 B1 * 4/2015 Aldaz ................. H01L 33/0075
                                                     257/E33.001
(Continued)

FOREIGN PATENT DOCUMENTS

CN        101449382 A      6/2009
CN        101465400 A      6/2009
(Continued)

OTHER PUBLICATIONS

Chinese Office Action, Chinese Application No. 2015/800666212, dated Nov. 13, 2015, 16 pages.
(Continued)

*Primary Examiner* — Patrick N Edouard
*Assistant Examiner* — Peijie Shen
(74) *Attorney, Agent, or Firm* — Fenwick & West LLP

(57) ABSTRACT

A display (100) comprising a plurality of LED chips (604), each LED chip (604) comprising a plurality of light emitting elements (606*a-c*). Each LED chip (604) is arranged such that a first light emitting element (606*a*) is configured to illuminate a sub-pixel, and a second light emitting element (606*b*) is configured to illuminate a sub-pixel using substantially the same wavelength of light as the first light emitting element. There is also described an LED chip, a display pixel, a controlling method, a computer device and a computer program for a display.

14 Claims, 5 Drawing Sheets

Related U.S. Application Data continuation of application No. 15/520,403, filed as application No. PCT/EP2015/074546 on Oct. 22, 2015, now Pat. No. 10,535,295.

(51) Int. Cl.
   *H01L 27/32* (2006.01)
   *G09G 3/32* (2016.01)
   *H01L 33/20* (2010.01)
   *H01L 27/15* (2006.01)

(52) U.S. Cl.
   CPC .......... *G09G 2300/0426* (2013.01); *G09G 2300/0443* (2013.01); *G09G 2300/0452* (2013.01); *G09G 2330/08* (2013.01); *H01L 27/156* (2013.01); *H01L 27/3218* (2013.01); *H01L 27/3255* (2013.01); *H01L 33/20* (2013.01); *H01L 2924/0002* (2013.01)

(56) References Cited

U.S. PATENT DOCUMENTS

| Patent/Pub No. | Date | Inventor | Class |
|---|---|---|---|
| 9,048,396 B2* | 6/2015 | Lowes | H01L 33/504 |
| 9,685,592 B2* | 6/2017 | Chan | H01L 33/486 |
| 10,262,977 B2* | 4/2019 | Henry | H01L 25/0753 |
| 10,515,580 B2* | 12/2019 | Henry | H01L 33/62 |
| 2002/0063258 A1* | 5/2002 | Motoki | H01L 33/32 257/79 |
| 2003/0034992 A1 | 2/2003 | Brown Elliott et al. | |
| 2004/0042198 A1 | 3/2004 | Cok | |
| 2004/0150651 A1 | 8/2004 | Phan | |
| 2005/0167682 A1* | 8/2005 | Fukasawa | H01L 33/60 257/E33.059 |
| 2006/0012985 A1* | 1/2006 | Archie | F25D 27/00 362/227 |
| 2006/0092644 A1* | 5/2006 | Mok | H01L 33/60 257/E33.059 |
| 2006/0290870 A1* | 12/2006 | Kwak | G02F 1/133514 349/144 |
| 2007/0013304 A1* | 1/2007 | Kaneko | H01L 33/20 313/512 |
| 2007/0114930 A1* | 5/2007 | Lee | H01J 11/32 313/582 |
| 2007/0152135 A1* | 7/2007 | Watanabe | G02F 1/133603 250/208.1 |
| 2007/0223219 A1* | 9/2007 | Medendorp, Jr. | H05B 47/10 257/E33.001 |
| 2007/0236134 A1* | 10/2007 | Ho | H01L 27/3213 313/506 |
| 2008/0158097 A1* | 7/2008 | Guo | G09G 5/02 345/55 |
| 2008/0304536 A1* | 12/2008 | Gold | F21S 10/02 372/101 |
| 2009/0109172 A1* | 4/2009 | Lee | G09G 3/344 345/107 |
| 2009/0302331 A1* | 12/2009 | Smith | H01L 27/3216 257/E33.062 |
| 2010/0259166 A1* | 10/2010 | Cok | H01L 27/3255 313/506 |
| 2010/0264445 A1* | 10/2010 | Niki | H01L 33/20 428/141 |
| 2010/0308350 A1* | 12/2010 | Bisberg | H01L 33/58 257/E33.056 |
| 2010/0317132 A1* | 12/2010 | Rogers | H01L 21/6835 257/E33.059 |
| 2011/0012820 A1* | 1/2011 | Kim | H01L 27/3218 345/82 |
| 2011/0043499 A1* | 2/2011 | Cok | G09G 3/3208 345/82 |
| 2011/0062457 A1* | 3/2011 | Naito | H01L 33/30 257/E21.04 |
| 2011/0105185 A1* | 5/2011 | Heald | G02B 26/001 29/829 |
| 2011/0211337 A1* | 9/2011 | Ito | G02B 19/0061 257/E33.073 |
| 2011/0233575 A1* | 9/2011 | Huang | H01L 27/153 257/E33.056 |
| 2011/0315999 A1* | 12/2011 | Sharma | H01L 33/0095 438/33 |
| 2012/0223875 A1* | 9/2012 | Lau | H05B 45/44 345/82 |
| 2012/0256814 A1* | 10/2012 | Ootorii | G09G 3/3208 345/82 |
| 2012/0307191 A1* | 12/2012 | Park | G02B 5/0236 349/144 |
| 2013/0075769 A1* | 3/2013 | Yan | H01L 33/00 257/89 |
| 2013/0235590 A1* | 9/2013 | Van Der Sijde | F21V 5/04 362/308 |
| 2013/0321477 A1* | 12/2013 | Gandhi | G09G 3/2022 345/690 |
| 2013/0328073 A1* | 12/2013 | Lowes | H01L 33/60 257/89 |
| 2013/0329425 A1* | 12/2013 | Lowes | H01L 33/502 362/293 |
| 2014/0027795 A1* | 1/2014 | Reiherzer | H01L 33/505 257/98 |
| 2014/0062301 A1* | 3/2014 | Sung | H05B 45/60 315/52 |
| 2014/0063853 A1* | 3/2014 | Nichol | G02B 6/0028 362/616 |
| 2014/0159043 A1* | 6/2014 | Sakariya | H01L 27/156 438/34 |
| 2014/0267683 A1 | 9/2014 | Bibl et al. | |
| 2014/0319486 A1* | 10/2014 | Hong | G09G 3/32 257/40 |
| 2014/0353645 A1* | 12/2014 | Jeong | H01L 27/3211 257/40 |
| 2014/0367633 A1* | 12/2014 | Bibl | H01L 27/3246 257/13 |
| 2014/0367713 A1* | 12/2014 | Zhang | H01L 33/507 257/89 |
| 2015/0015466 A1* | 1/2015 | Feng | G09G 3/007 345/76 |
| 2015/0023016 A1* | 1/2015 | Ishihara | H01L 33/62 362/267 |
| 2015/0035731 A1* | 2/2015 | Wang | H01L 27/3218 345/76 |
| 2015/0091787 A1* | 4/2015 | Ohmae | G09G 3/2003 345/83 |
| 2015/0153026 A1* | 6/2015 | Chen | F21K 9/232 362/249.02 |
| 2015/0154933 A1* | 6/2015 | Bae | G09G 3/3611 345/618 |
| 2015/0155435 A1* | 6/2015 | Nei | H01L 33/62 257/98 |
| 2015/0179873 A1* | 6/2015 | Wunderer | H01L 33/48 257/13 |
| 2015/0331285 A1* | 11/2015 | Bibl | H01L 33/504 362/84 |
| 2015/0348470 A1* | 12/2015 | Wang | G02B 5/201 345/694 |
| 2015/0348504 A1* | 12/2015 | Sakariya | G09G 3/2092 345/82 |
| 2016/0042704 A1* | 2/2016 | Yin | G02F 1/134309 345/88 |
| 2016/0240594 A1* | 8/2016 | Zhu | H01L 27/3216 |
| 2016/0276416 A1* | 9/2016 | Ma | H01L 27/3216 |
| 2016/0284766 A1* | 9/2016 | Wang | H01L 27/3211 |
| 2017/0084671 A1* | 3/2017 | Hack | H01L 27/3213 |
| 2017/0148771 A1* | 5/2017 | Cha | H01L 25/0753 |
| 2017/0213502 A1* | 7/2017 | Henry | H01L 25/0753 |
| 2017/0250167 A1* | 8/2017 | Bower | H01L 21/6835 |
| 2018/0166512 A1* | 6/2018 | Hack | H01L 27/3218 |
| 2018/0211580 A1* | 7/2018 | Su | G09G 3/2003 |

(56) References Cited

U.S. PATENT DOCUMENTS

2018/0211940 A1\* 7/2018 Henry ............... H01L 33/24
2018/0269268 A1\* 9/2018 Cai ............... H01L 27/3262

FOREIGN PATENT DOCUMENTS

| CN | 101465401 A | 6/2009 |
|---|---|---|
| CN | 103366683 A | 10/2013 |
| CN | 103367552 A | 10/2013 |
| CN | 103811593 A | 5/2014 |
| EP | 2011153 A2 | 1/2009 |
| JP | H08137413 A | 5/1996 |
| JP | 2008537804 A | 9/2008 |
| JP | 2009508171 A | 2/2009 |
| JP | 2009533810 A | 9/2009 |
| WO | WO 2016/016461 A1 | 2/2016 |

OTHER PUBLICATIONS

Chinese Patent Office, Office Action, Chinese Patent Application No. 201580066621.2, dated Dec. 2, 2020, eight pages.
Japan Patent Office, Japanese Patent Application No. 2017/522172, dated Nov. 26, 2019, 10 pages.
PCT International Search Report and Written Opinion, PCT/EP2015/074546, dated Dec. 22, 2015, 14 pages.
European Patent Office, Examination Report, European Patent Application No. 15784375.6, dated May 23, 2019, 10 pages.
International Preliminary Report on Patentability for International Application No. PCT/EP2015/074546, dated May 4, 2017, 11 Pages.

\* cited by examiner

DISPLAY, LED CHIP THEREFOR, PIXEL THEREFOR, CONTROLLING METHOD THEREFOR, COMPUTER PROGRAM THEREFOR

CROSS REFERENCE TO RELATED APPLICATIONS

This application is a continuation of U.S. application Ser. No. 16/707,890, filed Dec. 9, 2019, which is a continuation of U.S. application Ser. No. 15/520,403, filed Apr. 19, 2017, now U.S. Pat. No. 10,535,295, which is a National Phase application of International Application No. PCT/EP2015/074546, filed Oct. 22, 2015, which claims the benefit of United Kingdom Application No. GB1418772.8, filed Oct. 22, 2014, each incorporated by reference in its entirety.

TECHNICAL FIELD

The invention relates to the field of displays.

BACKGROUND

ILED (Inorganic Light Emitting Diode) displays provide an alternative to the better known LCD (Liquid Crystal Display) and the OLED (Organic Light Emitting Diode) displays. An ILED display does not have any of the negative qualities of LCD or OLED displays as its display sub-pixels are based on ILED light sources and has all the advantages of this class of device. This results in a display that has the better performance characteristics of an OLED type direct view display as well as the robustness, long-life and stability that is inherent to ILED technology.

Display pixel failure and need for repair presents additional complexity to the display manufacturing process. The number of acceptable malfunctioning pixels in a display is covered by ISO-13460-2. Most display manufacturers supply class 2 displays which allow no more than two malfunctioning pixels (always on or always off) per million pixels. This requires a display sub-pixel yield of 99.998%.

For a 1920×1080 display (FHD displays), which are becoming increasingly common in mobile phones, there are 2,073,600 display pixels. Therefore, in an ILED type display, 6,220,800 individual ILED chips must be packaged (an R, G and B for each display pixel). As each device must have both p and n contacts this results in 12,144,600 contacts that must be made. As per the ISO-13460-2 standard only 4 display sub-pixels may be malfunctioning. Therefore the required yield for LED devices and interconnection is 99.99996%. Achieving this target is a significant challenge in the development of ILED type displays.

To increase the yield of displays, redundancy for chips/interconnection failure is used. In standard designs, this is done by placing two ILED chips at each display sub-pixel. Using this solution a total 12,144,600 individual ILED devices must be fabricated and "pick-and-placed" during assembly of the display. Subsequently, or as part of the pick-and-place process, interconnection must be made to 24,289,200 contacts. This approach can successfully reduce the issue of device failure as the likelihood of two failed devices/interconnections in the same display sub-pixel is smaller than the risk with a single device/interconnection. However, there are implications for the cost and complexity of the system. In addition, the presence of multiple structures (i.e. other chips) in close proximity to an emitting ILED may results in unwanted reflections and other optical interference which affect the performance of the display. An example of this is the contrast-reducing light reflection that may be produced at the surface of the ILED chips.

SUMMARY

An ILED design is described that removes the need for two individual ILEDs chips at each display sub-pixel, whilst maintaining redundancy measures and reduces the number of connections required. This results in enhanced manufacturability of this class of display as well as opening the potential for new drive schemes which may simplify the associated electronics.

According to a first aspect, there is provided a display comprising:
    a plurality of LED chips, each LED chip comprising a plurality of light emitting elements;
        wherein each LED chip is arranged such that a first light emitting element is configured to illuminate a sub-pixel, and a second light emitting element is configured to illuminate a sub-pixel using substantially the same wavelength of light as the first light emitting element.

As an option, the first and second light emitting elements are selected from any of an inorganic LED and an organic LED.

Optionally, the first light emitting element is configured to illuminate a sub-pixel of a first display pixel and the second light emitting element is configured to illuminate a sub-pixel of a second display pixel.

Each LED chip optionally comprises a plurality of Addressable Array Elements, each Addressable Array Element providing a light emitting element.

As an option, each ILED chip is integrated with a substrate, the substrate configured to provide control and power to each ILED chip.

The substrate optionally comprises any of an active matrix control and a passive matrix control.

The display optionally further comprising an optical film disposed over the plurality of LED chips, the optical film configured to direct light from each light emitting element.

As an option, each LED chip has a geometric shape such that each light emitting element is located substantially at a corner of the LED chip. As a further option, each LED chip is substantially triangular, having a light emitting element located towards each corner, and each display pixel is substantially hexagonal, each LED chip being located at an intersection of three adjacent display pixels thereby forming a sub-pixel in each of the three adjacent display pixels.

As an option, a display pixel comprises a first sub-pixel provided by a first light emitting element from a first LED chip and a second sub-pixel provided by a second light emitting element from a second LED chip, and the first and second light emitting elements share a common cathode.

Each LED chip optionally comprises a phosphor such that, in use, each LED chip can emit light at more than one wavelength.

According to a second aspect, there is provided an LED chip configured for use in a display, the LED chip comprising a first and a second light emitting element arranged to illuminate a sub-pixel, each light emitting element arranged to emit light at substantially the same wavelength.

As an option, each light emitting element is located on the ILED chip such that it forms a sub-pixel for a display pixel, and no two light emitting elements forms sub-pixels for the same display pixel.

The LED chip optionally comprises a plurality of Addressable Array Elements, each Addressable Array Element providing a light emitting element.

The LED chip is optionally integrated with a substrate, the substrate configured to provide control and power to the LED chip.

As an option, the LED chip is substantially triangular, having a light emitting element located towards each corner, such that the LED chip is locatable at an intersection of three adjacent hexagonal display pixels thereby providing a sub-pixel in each of the three adjacent display pixels.

According to a third aspect, there is provided a display pixel for a display, the display pixel comprising:

a plurality of light emitting elements located in the display pixel, each light emitting element provided by a different ILED chip.

According to a fourth aspect, there is provided a method of controlling a display, the method comprising controlling power to a plurality of light emitting elements located in a display pixel of the display, each light emitting element in the display pixel provided by a different ILED chip.

According to a fifth aspect, there is provided a computer device comprising:

an output connecting the computer device to the display and configured to control power to a plurality of light emitting elements located in a display pixel of the display, wherein either each light emitting element in the display pixel provided by a different ILED chip or a single chip for a display pixel comprises at least two light emitting elements configured to emit light at substantially the same wavelength; and a processor configured to control the display.

According to a sixth aspect, there is provided a computer program comprising computer readable code which, when run on a computer device, causes the computer device to control power to a plurality of light emitting elements located in a display pixel of a display, each light emitting element in the display pixel provided by a different ILED chip.

According to a seventh aspect, there is provided a computer program product comprising a computer readable medium and a computer program according to claim 20, wherein the computer program is stored on the computer readable medium.

The computer readable medium is optionally a non-transitory computer readable medium.

DETAILED DESCRIPTION

The following abbreviations are used in this description:

Light Emitting Diode A semiconductor device which produces light when the (LED) appropriate electrical bias is provided. It is noted that a micro-LED (µLED) may be considered a type of LED.

Emitter Any light emitting source, generally an LED. It is noted that a µLED emitter may be an emitter and may comprise only a part of a µLED device.

LED chip A piece of semiconductor material that can generate light and has been singulated from a semiconductor wafer on which it has been fabricated.

Single Emitter Chip An LED chips with only one emitting region (or emitter).

(SEC) Generally the whole chip will illuminate, although this may not be the case in respect of µLEDs.

Addressable Array An LED chip which has more than one distinct light generating

Chip (AAC) region (or emitter) that can be independently addressed.

Addressable Array An independently addressable emitting area (or emitter) in an

Element (AAE) Addressable Array Chip.

Non-addressable An LED chip which has more than one distinct light generating

Array Element region (or emitter) which cannot be independently addressed.

(NAC)

Display Pixel: A component of a display that is used to build the total image. It generally consists of R, G and B sub-pixels which can be independently controlled to produce a range of colours.

Display Sub-Pixel: A sub-section of the Display Pixel which typically comprises a single colour (generally R, G or B).

Exemplary displays comprise the arrangement of R, G and B display sub pixels to form a single display pixel. A typical configuration for an ILED display 100 is highlighted in FIG. 1, where each pixel 102 comprises R, G and B chips 104a-c packed together to provide the necessary light for each pixel 102 of the display 100. In this example, each R, G and B chip 104a-c has one emitting area per chip or, more generally, the whole active area of the chip illuminates. These are termed Single Emitter Chips (SECs). The typical/minimum size of these R, G, B chips 104a-c is 20 µm×20 µm although there are examples where smaller devices are used. For larger displays with moderate resolution the one to one relationship between SEC and display sub-pixel results in the requirement for a very large number of ILED chips. The inventors have appreciated that this raises significant manufacturability and cost challenges. For ultra-high resolution or very small displays, the size of the SECs may limit the area and size of the display sub-pixels and thus the overall display resolution.

Figure 2:
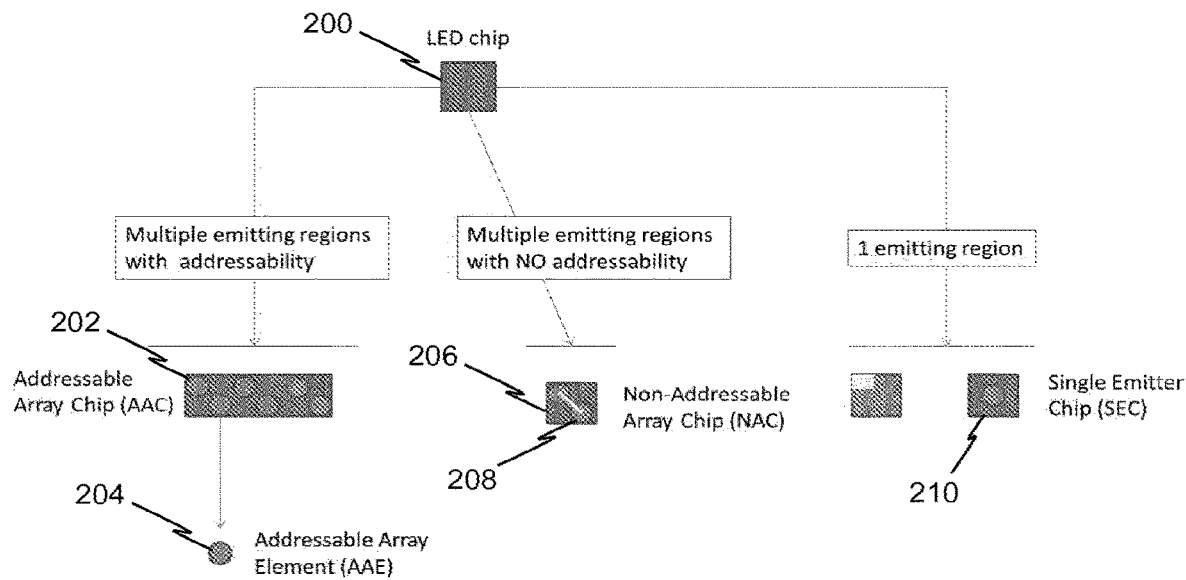
FIG. 2 illustrates schematically distinctions between LED chip types as described herein.
Figure 3:
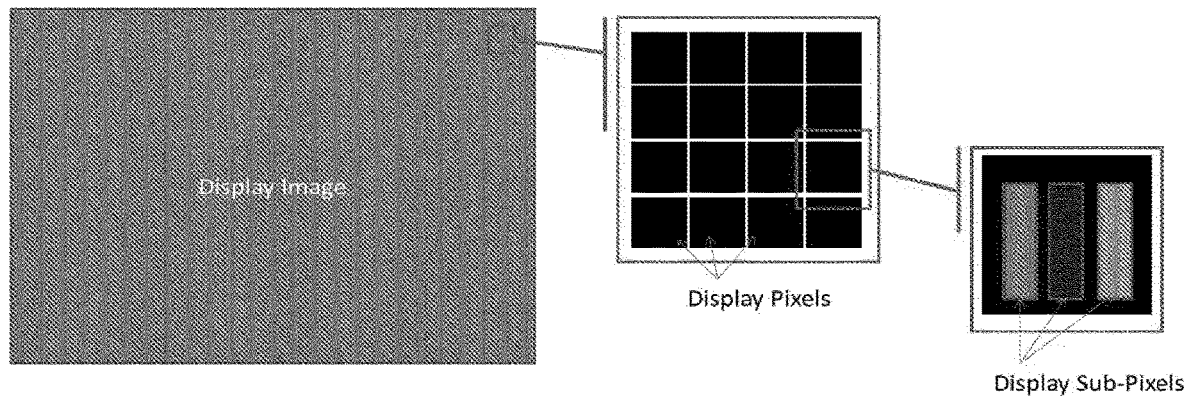
FIG. 3 illustrates schematically exemplary components of a display.

FIG. 2 illustrates schematically a relationship between various ILED chip types. From FIG. 2, it can be seen that an LED chip 200 may have at least three different types: an addressable array chip 202, which comprises a plurality of addressable array elements (or emitters) 204; a non-addressable array chip 206, which comprises a plurality of array elements (or emitters) 208 that cannot be addressed individually; and a SEC 210.

Figure 4:
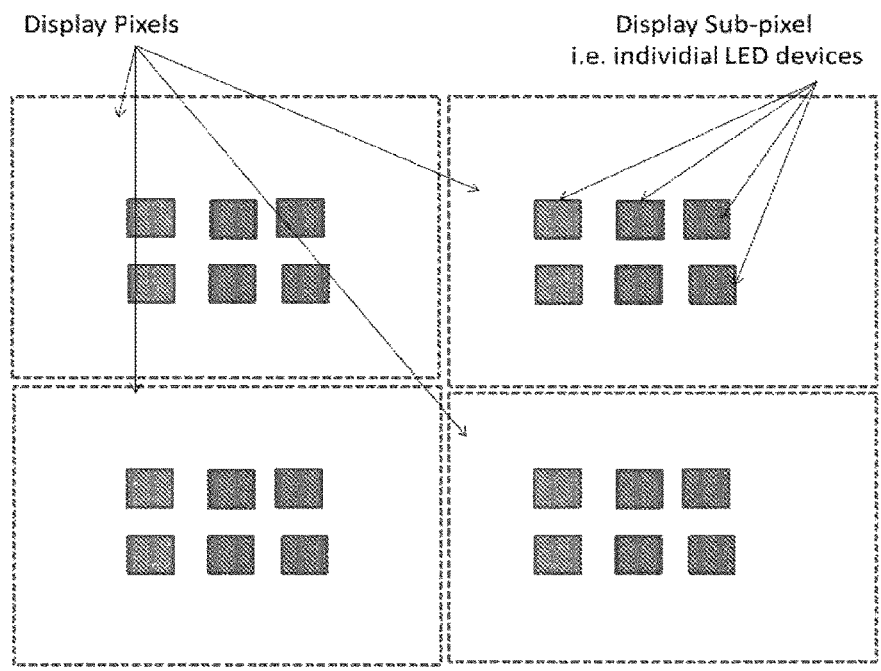
FIG. 4 illustrates schematically a plan view of an exemplary ILED layout having sub-pixel redundancy.

Redundancy in ILED based displays reduces the risk of failed ILED devices or interconnections, which may result in failed display pixels or sub-pixels. Adding extra ILED chips at each display sub-pixel, as shown in FIG. 4, will result in double the wafer area, double the pick-and-place steps, double the electronic drivers and double the interconnections. FIG. 4 shows a display with redundancy for each sub-pixel. Other exemplary displays disclosed herein use arrays of Addressable Array Elements to reduce the above requirements. Each ILED Addressable Array Chip may contain more than one independently addressable light source. This allows for the ILED to illuminate multiple display sub-pixels from a single chip or to have a second element on the same chip in each display sub-pixel which illuminates if there is a failure in the first element.

Figure 5:
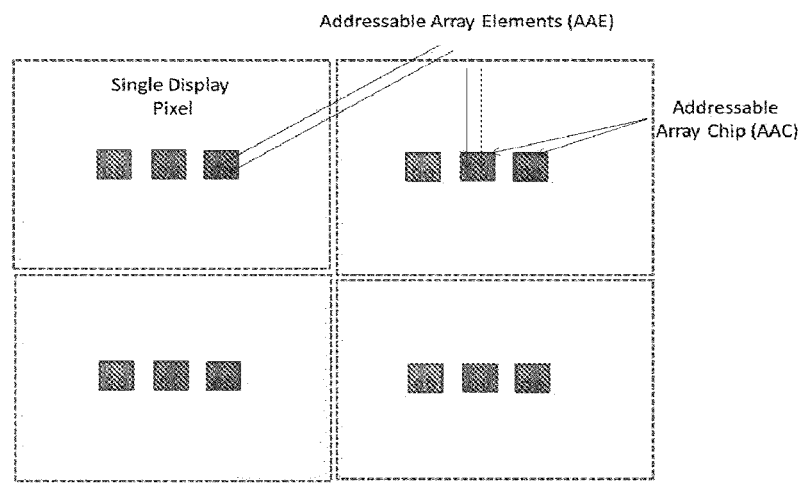
FIG. 5 illustrates schematically a plan view of an exemplary ILED layout with two corresponding Addressable Array Elements from Addressable Array Chips for each display pixel.

FIG. 5 illustrates an exemplary display 500 that allows for more than the minimum number of Emitters in each display pixel 502—i.e. it provides additional Emitters in each pixel/sub pixel. The use of arrays mean that, while there are more available emitters, there is a reduction in the number of chips (and hence pick-and-place steps) when compared to other redundancy processes.

Exemplary displays disclosed herein are, therefore, a low cost and less complex route to including redundancy in an ILED display.

Exemplary methods and apparatus disclosed present displays comprising ILED chips and methods for their assembly, such that redundancy against ILED chip failure is included in the system without a significant increase in manufacturing complexity.

A display consists of a large array of individual display components that can be selectively illuminated. These components are referred to as Display Pixels. In a multi-colour display the smaller components related to the different colours are called Display sub-pixels. A display pixel comprises a plurality of display sub-pixels. In general the different colours used for sub-pixels are red, green and blue (R, G, and B).

Typically, for an LCD display, the display sub-pixels are created by colour filters and a liquid crystal optical element to selectively allow the transmission of light from a white backlight based on the pixel state. In typical ILED displays, a large array of individually addressable R, G and B ILEDs are selectively illuminated based on the pixel state to generate pixels of various colours using the intensity of light from each sub-pixel. In typical ILED display designs, Single Emitter Chips (SECs) are used. No colour filter or liquid crystal is required. As the size or resolution of a display is increased the total number of ILED chips required increases.

In the current invention, an array of Addressable Array Elements (AAEs) is fabricated on Addressable Array Chips (AACs). FIG. 2 illustrates the relationship between AAEs and AACs. These array chips reduce the number of chips that must be placed and the number of interconnections required.

In exemplary displays, the AACs are placed at an interface between two adjacent display pixels. The AACs can then be used to selectively illuminate a sub-pixel in each of the adjacent display pixels (forming the display sub-pixels of the display). As each AAC contains more than one Element (or emitter), each ILED chip can be used to illuminate more than one display sub-pixel and, hence, a number of important considerations in the manufacturing of these displays are simplified.

Figure 6:
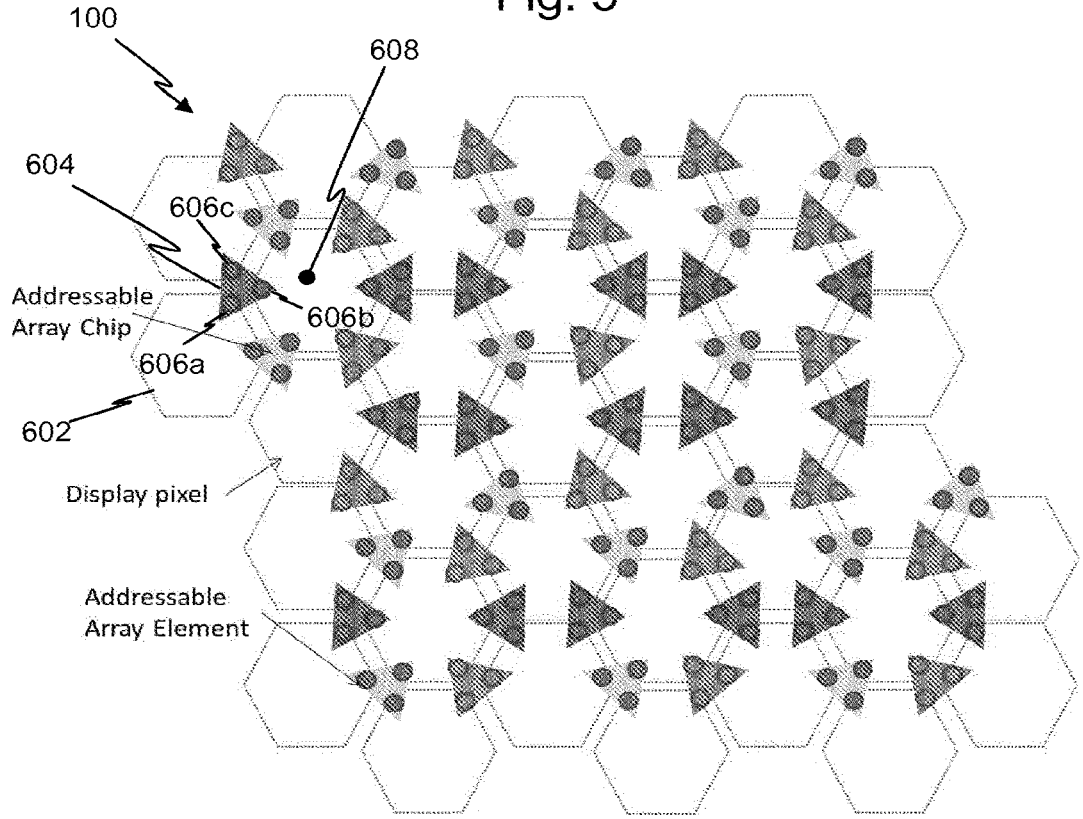
FIG. 6 illustrates schematically a plan view of an exemplary display having addressable LED arrays for illumination of multiple display sub pixels.

An example of such a layout is provided in FIG. 6, which shows a display 600 comprising a plurality of pixels 602. A plurality of ILED chips 604, each comprising a plurality of individually addressable emitters 606a-c are arranged at the interface between adjacent display pixels 602, such that each emitter 606a-c is in a different display pixel 602. The ILED chips 604 comprise red, green or blue emitters (typically, all the same colour on a single ILED chip 604) and they are arranged at the interface (or border) between adjacent display pixels 602 such that each display pixel comprises at least one emitter 604a-c of each colour.

In the exemplary display 600, the ILED chips 604 comprise three emitters 606a-c of a single colour and the display pixels 602 have a hexagonal shape. Therefore, the ILED chips 604 can be arranged such that two emitters (from different ILED chips) of each colour are in each display pixel 602, as shown in FIG. 6. As such, each sub-pixel of a display pixel 602 comprises two emitters 606a-c that are each from a different ILED chip 604.

Exemplary displays may contain one or more of the following:
  ILED chips of a single colour;
  Each ILED chip contains a plurality of Elements (i.e. each ILED formed by an array of N×M elements (or emitters) also known as an Addressable Array Chip);
  The light from individual elements (or emitters) in an ARC can be used to illuminate one or more display sub-pixels; and
  A substrate, which enables electronic driving and control of the ILED chips or which has contacts to an electronic driver.

The ILED chips are designed as Addressable Array Chips (AACs) with more than one individually Addressable Array Elements (AAEs). The location of the elements on the AACs is dependent on the target illumination area on the display.

In the current invention ILED chips are designed and packaged to reduce the total number of LED chips required.

Figure 1:
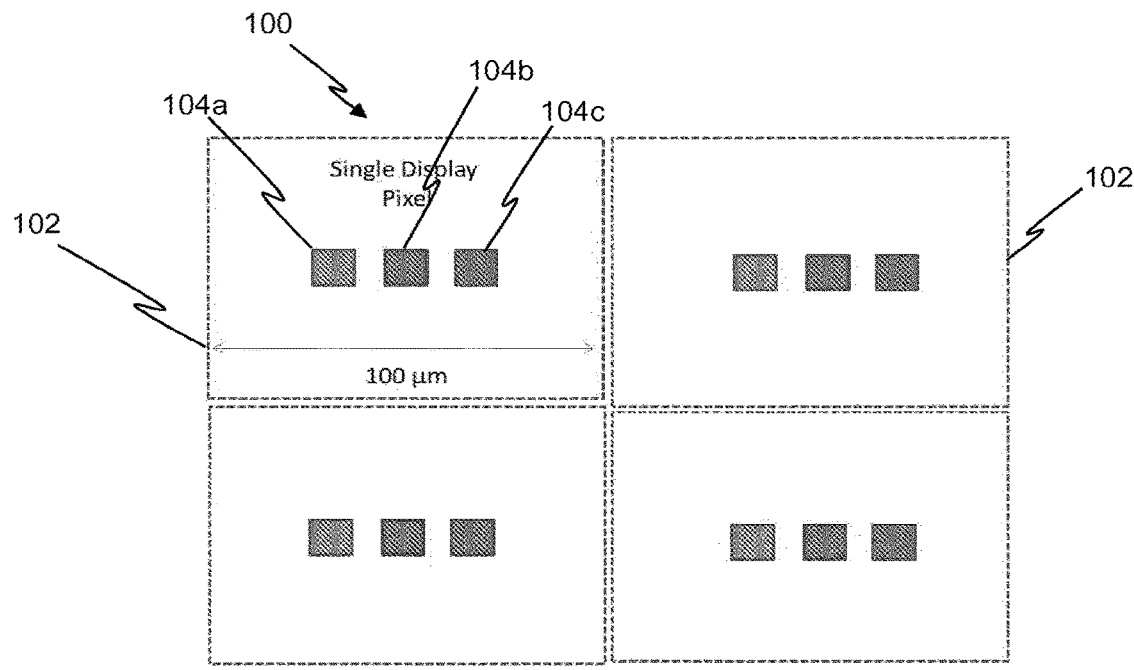
FIG. 1 illustrates schematically a plan view of an exemplary ILED layout.

Shown in FIG. 1 is a top down view of a basic ILED display 100. Within each display pixel 102 are individual ILED chips 104a-c, in this case 3 single R, G and Blue ILED chips each containing a single emitter—i.e. the chips are Single Emitter Chips (SECs). These ILED chips 104a-c form the display sub-pixels of the display pixel 102 and each chip is individually addressable. It should be noted that for simplicity only a single light source/LED is shown for each display sub-pixel (i.e. there is no redundancy in this figure).

Shown in FIG. 4 are four display pixels (in the same configuration as that of FIG. 1) where redundancy for device failure has been included based on SECs. The addition of redundancy to the design in FIG. 1 results in double the number of chips that must be fabricated and successfully mounted/interconnected.

Standard ILED-type displays use a SEC for each Display sub-pixel. In larger displays this requires a very large number of ILED chips, pick-and-place steps and interconnections. As outlined above, more than 12 million individual LED chips are required for a 1920×1080 display. To satisfy class 2 standards, only four display sub-pixels can be defective. This results in a very significant challenge to the manufacture of such displays. In order to overcome yield issues, redundancy against device or connection failure is designed into the system. This generally is achieved by placing two SECs for each display sub-pixel. While this may reduce the number of rejected displays, it is a significant increase in the pick-and-place process steps required, the amount of ILED material required and the complexity of the electronic drive system. It should be noted that for all ILED displays fabricated a parallel method of pick-and-place is used to allow for and reduce the large number of placements. However, this does not reduce the complexity of a high number of devices to be placed as, even in a parallel process, an increase number of devices will also increase the probability of a device failure. This may be due to the failure to pick a device, to release a device, a device being placed in an incorrect location or a failure to electrically connect to the device.

An example of a simple system without redundancy is shown in FIG. 1 while a system with redundancy included is shown in FIG. 4.

In exemplary methods and apparatus disclosed herein, ILED chips comprise Addressable Array Chips (AAC) used to illuminate the display pixels. In one exemplary apparatus, an AAC may contain two Addressable Array Elements (AAE) (e.g. ILED emitters). The ILED emitters can be selectively illuminated, such that one or both of the ILED emitters can be illuminated. In the case of the failure of an Element on the AAC, the other active Element on the device can be used. The approach of using an AAC will reduce by 50% the number of pick-and-place steps for the assembly of the displays. As the AAC may be fabricated with a common ground line between the two active elements, the current invention would require only three connections per display sub-pixel (two anodes and one cathode). In contrast the standard solution requires four connections per display sub-pixel, an increase of 33%, to connect the one anode and one cathode on each LED.

Figure 7:
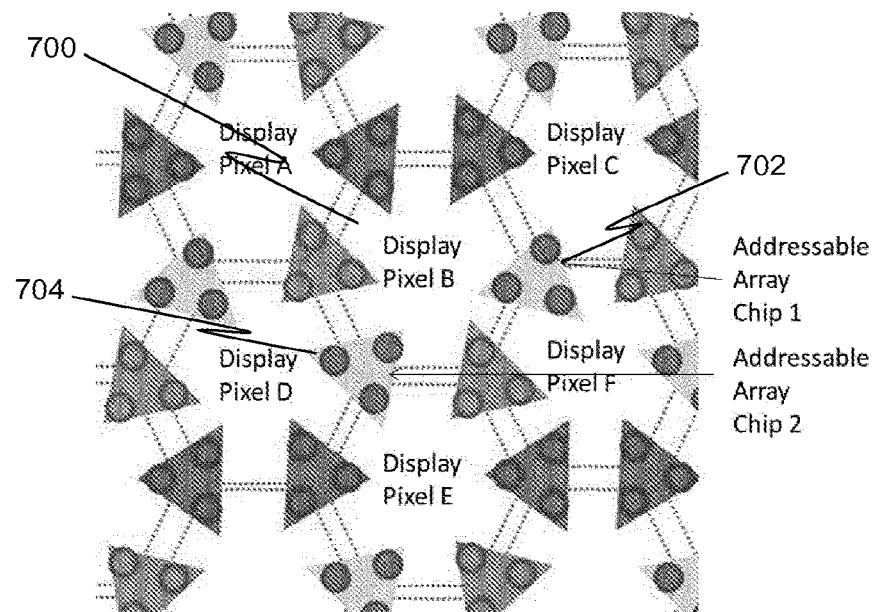
FIG. 7 illustrates schematically a close view of addressable array devices used to illuminate multiple display pixels.

In another exemplary display, each AAC may comprise more than two Addressable Array Elements (or emitters). These AACs can be subsequently positioned such that each element on an AAC illuminates a different display sub-pixel, each on an adjacent display pixel. In this design the number of pick-and-place steps and interconnections is greatly reduced while maintaining the redundancy of this system. An example of such as design is shown in FIG. 6. A closer look at the display pixels are shown in FIG. 7. In these figures, the boundaries of the display pixels are shown by the dotted hexagon shape.

Referring to FIG. 7, a display Pixel B 700 can be illuminated by a blue Element on Addressable Array Chip 1 702 or a blue Element on Addressable Array Chip 2 704. Therefore, redundancy for the blue display sub-pixel is provided by Addressable Array Chip 2 704 if the left most emitter on Addressable Array Chip 1 702 fails. Similarly for the red and green display sub-pixels, redundancy is provided by emitters on other Addressable Array Chips. It is noted that the number of chips required to provide redundancy in the above design is reduced compared to known redundancy methods. For Display Pixel B a total of six Addressable Array Chips are required. However, these Addressable Array Chips are sharing their Addressable Array Elements with other Display Pixels. Each Addressable Array Chip provides a third of its emitters to Display Pixel B. Therefore it can be said that two Addressable Array Chips are required for each Display Pixel—in contrast to three in other designs with no redundancy (FIG. 1) or six in other designs with redundancy (FIG. 4).

Each of the Addressable Array Chips may also share a cathode connection. Therefore, the total number of connections is reduced. For each display pixel there will be six anodes (one for each of the emitters/active regions) and a third of six cathodes (which are shared) resulting in eight interconnections. In contrast other ILED displays with redundancy require twelve interconnections.

Note that the positioning of the Addressable Array Element in the display sub-pixels will not be a significant issue. The relative position and pitch of the Addressable Array Elements is of greater importance than the actual location. Due to the high resolution of current generation displays, the distance between a failed Addressable Array Element and its replacement will be in the range from 30-200 µm. This displacement will not be significant especially when the failed pixels are randomly distributed across the screen. In addition when a replacement AAE must be used due to the failure of the "preferred" AAE then other "replacement" AAEs may also be selected. The number of "replacement" pixels used could be decreased as distance increases from the malfunctioning pixel. Hence the effect of positional variation caused by a failed Element would be gradual and not obvious to human perception.

For the above layout there may exist a "preferred" Addressable Array Element that could be illuminated such that the pitch between display sub-pixels is optimized for viewer experience. In the majority of cases this preferred Element will be functioning and can be used. For example, in a 1920×1080 display there are 6,220,800 display sub-pixels. If 10 of these display sub-pixels were malfunctioning then, without redundancy, this display would be discarded. However, using the current invention these malfunctioning pixels could be corrected with only 0.00016% of Addressable Array Elements in their non-optimum location. Note that these non-optimum Elements would, in all probability, be randomly distributed around the display.

Another feature of an ILED display using Addressable Array Chips is the use of optical films or elements to position the light appropriately. Such films have the ability to direct light with high efficiency. In the current invention such films may be used to bring the light from emitters at the edge of a display pixel to its centre. This would allow for the optimization of the spatial distribution of the light within the display pixel. In effect, this optical film would position the light from the "replacement" Element such that it was close to the position of the "preferred" Element or the appropriate position in the display sub-pixel.

An alternative method of producing three colour display sub-pixels is the conversion of a monochromatic light source into more than one colour. This can be achieved using a number of materials including traditional phosphors (for example Yttrium aluminium garnet, $Y_3Al_5O_{12}$), quantum dots or colloid phosphors. For devices such as the LED with a pixel diameter in the order of less than 50 µm, a quantum dot solution would provide adequate uniformity. For such a design, a blue ILED Addressable Array Chip containing three Addressable Array Elements may be fabricated in a single colour. Quantum dot materials, which convert to two wavelengths, would be placed in the path of the emitted light for two of these Elements. The effect of the quantum dots phosphors would result in light at three wavelengths being produced by a single chip.

This Addressable Array Chip could form the totality of the display sub-pixel or two could be used to provide redundancy.

Figure 8:
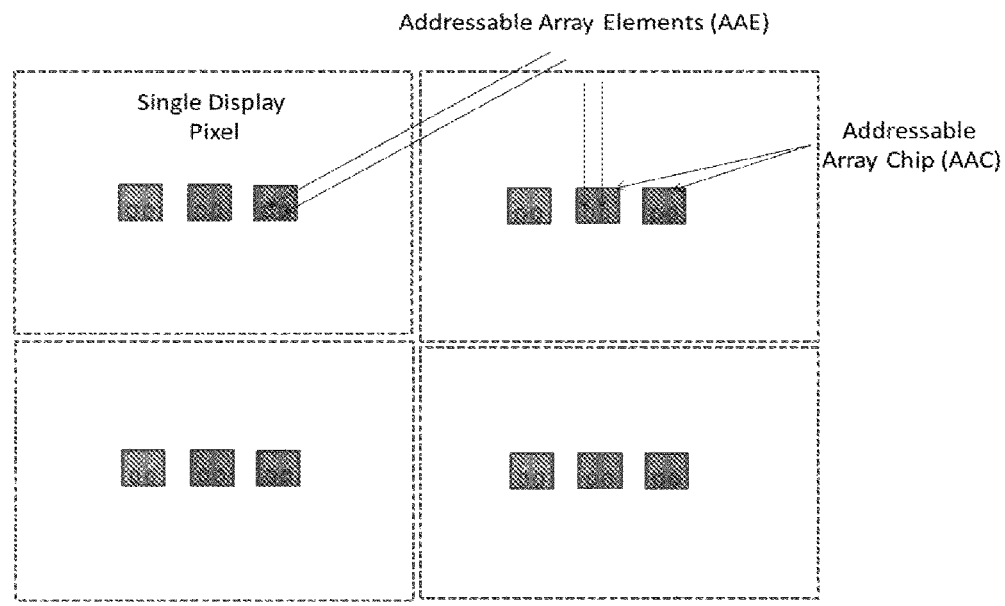
FIG. 8 illustrates schematically a plan view of an "array in centre" layout.

Shown in Table 1 is a comparison of the current invention and a standard ILED display with redundancy in a number of the major factors associated with Display manufacturing. It is assume that each anode and cathode contact requires 10 um². It is further assumed that both contacts are on the same side of the device. While contacting to opposite sides of an ILED chips is possible, it is problematic as it restricts the area available for light extraction from the light source. An example of the "Array in Centre" design is shown in FIG. 8. FIG. 4 shows a standard ILED design with redundancy and FIG. 6 shows the "Array at edges" design.

TABLE 1

Overview of various parameters for the fabrication of
1920 × 1080 ILED type display in standard design and
using the design proposed in the current invention.

| Design | Pick & Place placements | Chip area (mm²) | Interconnections |
|---|---|---|---|
| Standard | 12,441,600 | 248.0 | 24,883,200 |
| Array in centre | 6,220,800 | 186.6 | 18,662,400 |
| Array at edges | 4,147,200 | 165.9 | 16,588,800 |

In one exemplary display, the ILED Addressable Array Chips are towards the centre of the display pixel as shown in FIG. 8. In another exemplary display, the ILED Addressable Array Chips are towards the edge of the display pixel and the emitters of an AAC may illuminate more than one display pixel. In another exemplary display, the light from the ILED Addressable Array Chips is coupled to an optical film which positions the light appropriately before it emerges from the display.

In another exemplary display, ILED Addressable Array Chips with quantum dot phosphors would be used to produce multiple wavelengths from a single chip.

Figure 9:
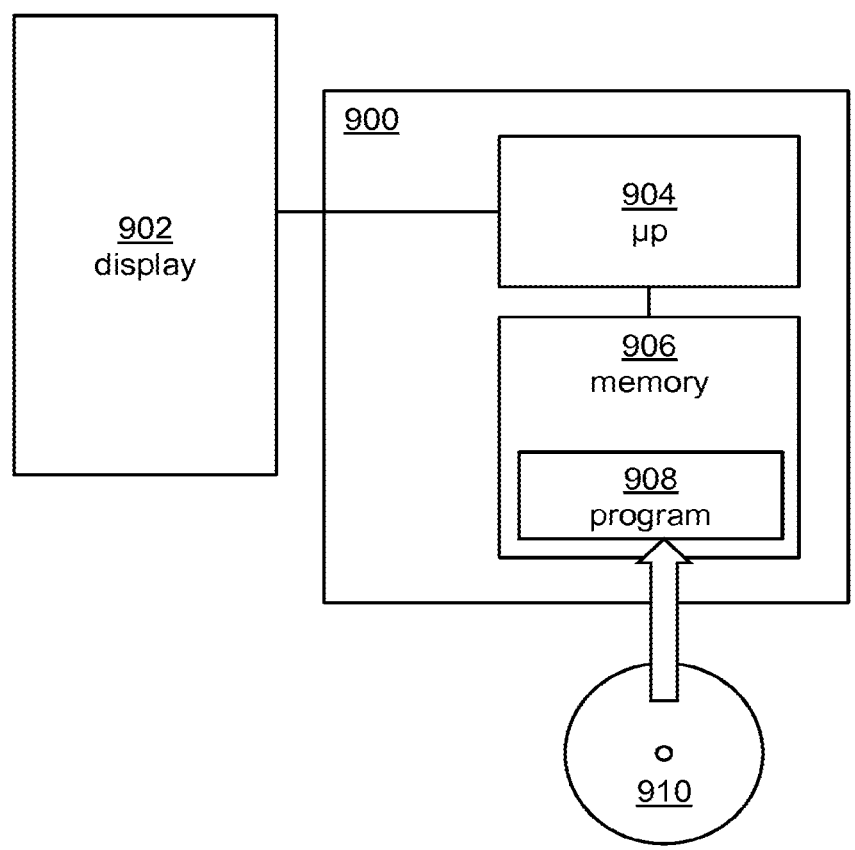
FIG. 9 illustrates schematically in a block diagram an exemplary computer device.

FIG. 9 illustrates schematically in a block diagram an exemplary computer device 900. The computer device is connected to a display 902 that comprises display pixels, for example, as shown in FIGS. 5 to 8. A processor 904 controls the display and selectively provides power to the ILED Addressable Array Chips of the display. A non-transitory computer readable medium in the form of a memory 906 is provided, which is used for storing a program 908 which, when executed by the processor 904, causes the processor to behave as described above. Note that the program may be provided from an external computer readable medium 910, such as a CD, a flash drive, a carrier wave and so on.

Whilst specific embodiments of the invention are described above, it will be appreciated that a number of modifications and alterations may be made thereto without departing from the scope of the invention as defined in the appended claims.

Numbered Clauses

1. An ILED type display such that there is more than 1 Addressable Array Elements for each display sub-pixel and therefore provides redundancy against device failure and contains:
  a. A plurality of ILED chips
  b. Each ILED chip contains a plurality of Addressable Array Elements (i.e. each ILED chip is an Addressable Array Chip).
  c. The light from individual Addressable Array Elements in an Addressable Array Chip can be used to illuminate one or more display sub-pixels.

2. As per clause 1, where the Addressable Array Chips are integrated with a substrate which enables electronic driving and control of the ILED chips or which has contacts to an electronic driver.

3. As per clause 1, where an optical film is used to position the light from a plurality of Addressable Array Elements to the appropriate positions within the display pixel.

4. As per clause 1, where the ILED Addressable Array Elements Chips are at multiple wavelength for example red, green and blue.

5. As per clause 1, the ILED Addressable Array Chips are in geometric shapes with the emitters primarily at the corners.

6. As per clause 1, a display layout whereby an ILED Addressable Array Chips is placed towards the centre of a display sub-pixel and the plurality of Addressable Array Elements can be selectively illuminated such that redundancy against device failure is provided.

7. An ILED display layout whereby an ILED Addressable Array Chips is placed towards the edge of multiple display pixels such that the plurality of Addressable Array Elements may illuminate more than 1 display sub-pixel and as such, provide redundancy.

8. An ILED display such that the Elements providing redundancy share a common cathode on the Addressable Array Chip.

9. As per clause 2, where the control substrate is an active matrix.

10. As per clause 2, where the control substrate is a passive matrix.

11. As per clause 1, where phosphors are integrated with the ILED Addressable Array Chips such that more than one wavelength is produce by each chip.

12. An optical film which is integrated with an ILED array such that the light is controlled before it emerges from the display sub-pixel.

The invention claimed is:

1. A display comprising:
  a substrate; and
  a plurality of discrete light emitting diode (LED) chips, each discrete LED chip of a triangular shape and including a plurality light emitting elements configured to emit light having the same color, the plurality of discrete LED chips arranged on the substrate to form display pixels of the display, each display pixel including:
    a first plurality of sub-pixels of a first color at corners of a first subset of the discrete LED chips,
    a second plurality of sub-pixels of a second color at corners of a second subset of the discrete LED chips, and
    a third plurality of sub-pixels of a third color at corners of a third subset of the discrete LED chips.

2. The display of claim 1, further comprising an optical film disposed on at least one of the discrete LED chips, the optical film configured to direct light from the at least one of the discrete LED chips.

3. The display of claim 2, wherein the optical film is configured to direct the light to a center of a display pixel.

4. The display of claim 1, further comprising a processor configured to provide power to one of the two light emitting elements of each sub-pixel.

5. The display of claim 4, wherein the processor is configured to provide power to a first light emitting element of the two light emitting elements responsive to a failure in a second light emitting element of the two light emitting elements.

6. The display of claim 1, wherein the plurality of discrete LED chips include the same type of semiconductor material.

7. The display of claim 1, wherein each of the plurality of discrete LED chips comprises Addressable Array Elements, each Addressable Array Element of a discrete LED chip providing a light emitting element.

8. The display of claim 1, wherein the substrate is configured to provide control and power to the plurality of discrete LED chips.

9. The display of claim 1, wherein the substrate includes an active matrix.

10. The display of claim 1, wherein the substrate includes a passive matrix.

11. The display of claim 1, wherein each discrete LED chip is located at an intersection of three adjacent display pixels.

12. The display of claim 1, wherein the plurality of light emitting elements of each discrete LED chip share a common cathode.

13. The display of claim 1, wherein a portion of the LED chips include quantum dot phosphors.

14. The display of claim 1, wherein a first portion of the plurality of discrete LED chips emit red light, a second portion of the plurality of discrete LED chips emit blue light, and a third portion of the plurality of discrete LED chips emit green light.

* * * * *